(12) United States Patent  (10) Patent No.: US 7,603,786 B2
Zhang et al.  (45) Date of Patent: Oct. 20, 2009

(54) PIEZOELECTRIC QUARTZ LEVEL SENSOR

(75) Inventors: Fuxue Zhang, Beijing (CN); Wei Zhang, Beijing (CN)

(73) Assignee: Beijing Information Technology Institute, Beijing (CN)

( * ) Notice: Subject to any disclaimer, the term of this patent is extended or adjusted under 35 U.S.C. 154(b) by 0 days.

(21) Appl. No.: 11/906,201

(22) Filed: Sep. 29, 2007

(65) Prior Publication Data

US 2009/0013543 A1    Jan. 15, 2009

(30) Foreign Application Priority Data

Jul. 9, 2007   (CN) .................. 2007 1 0118525

(51) Int. Cl.
    *G01C 9/06*   (2006.01)
(52) U.S. Cl. ..................... 33/366.11; 33/365
(58) Field of Classification Search ............. 33/366.11, 33/366.12, 366.13, 366.14, 366.25, 1 N, 365; 73/382 R; 200/61.52
    See application file for complete search history.

(56) References Cited

U.S. PATENT DOCUMENTS

| | | | |
|---|---|---|---|
| 3,560,772 A * | 2/1971 | Lungo et al. ................ 310/344 |
| 3,974,466 A * | 8/1976 | Tanaka ....................... 333/200 |
| 4,814,753 A * | 3/1989 | Coppola ...................... 340/689 |
| 5,095,762 A * | 3/1992 | Holm-Kennedy et al. ............... 73/862.041 |
| 5,101,669 A * | 4/1992 | Holm-Kennedy et al. ............... 73/862.626 |
| 5,992,032 A * | 11/1999 | Chiang et al. ............ 33/366.11 |
| 6,073,355 A * | 6/2000 | Chiang et al. ............ 33/366.11 |
| 6,536,123 B2 * | 3/2003 | Tamura ....................... 33/356 |

FOREIGN PATENT DOCUMENTS

WO    WO 03/087719    * 10/2003

\* cited by examiner

*Primary Examiner*—R. A. Smith (57) ABSTRACT

The present invention relates to a new piezoelectric quartz level sensor mainly applied in the attitude stabilized and control system of the aircraft, robot, vehicle, ship, oil drilling platform, construction, industrial automation equipment, radar, and satellite, comprising a sensitive element, signal processing circuit, base, outer case and socket. The piezoelectric quartz level sensor transfers the deflection angle of the object to the force exerted on two symmetrical mounted round piezoelectric quartz wafers, and then utilizing the prominent force sensitivity of the piezoelectric quartz, the level attitude parameter of an objected can be detected through the frequency variation due to the force exerted on the two piezoelectric quartz wafers. Therefore, the present invention can satisfy the demand of high stability and resolution, low non-linear degree, quick start time, wide measuring range and operating temperature, good ability to resist shock, and digital output.

16 Claims, 8 Drawing Sheets

PIEZOELECTRIC QUARTZ LEVEL SENSOR

BACKGROUND OF THE PRESENT INVENTION

1. Field of Invention

The present invention relates to a new piezoelectric quartz level sensor mainly applied in the attitude stabilized and control system of the aircraft, robot, vehicle, ship, oil drilling platform, construction, industrial automation equipment, radar, and satellite, comprising a sensitive element, signal processing circuit, base, outer case and socket.

2. Description of Related Arts

The level sensor utilizing the prominent strength sensitivity property of the piezoelectric quartz exists. The measurement range of the piezoelectric quartz tilt measuring device from Japanese Tokyo Denpa C., LTD is 5.7°, the accuracy is 0.12°, it can us used for 3000 times, and the operating temperature is from −10° C. to 50° C., mainly used for measuring the tilt angle of the construction and bridge. Sundstrand Data Control Company from USA designs a two-axis and three-axis tilt measurement device composed of QA-1300 quartz flexible accelerometer has a accuracy of 0.23°, mainly used for oil distilling. However, these piezoelectric quartz level sensors have drawbacks of low stability and resolution, long time start time, lower ability to resist shock, therefore, they can not satisfy the demand of high stability and resolution, good ability to resist shock, and quick start time.

SUMMARY OF THE PRESENT INVENTION

A main object of the present invention is to provide a piezoelectric quartz level sensor of high stability and resolution, good ability to resist shock, and quick start time.

Figure 1:
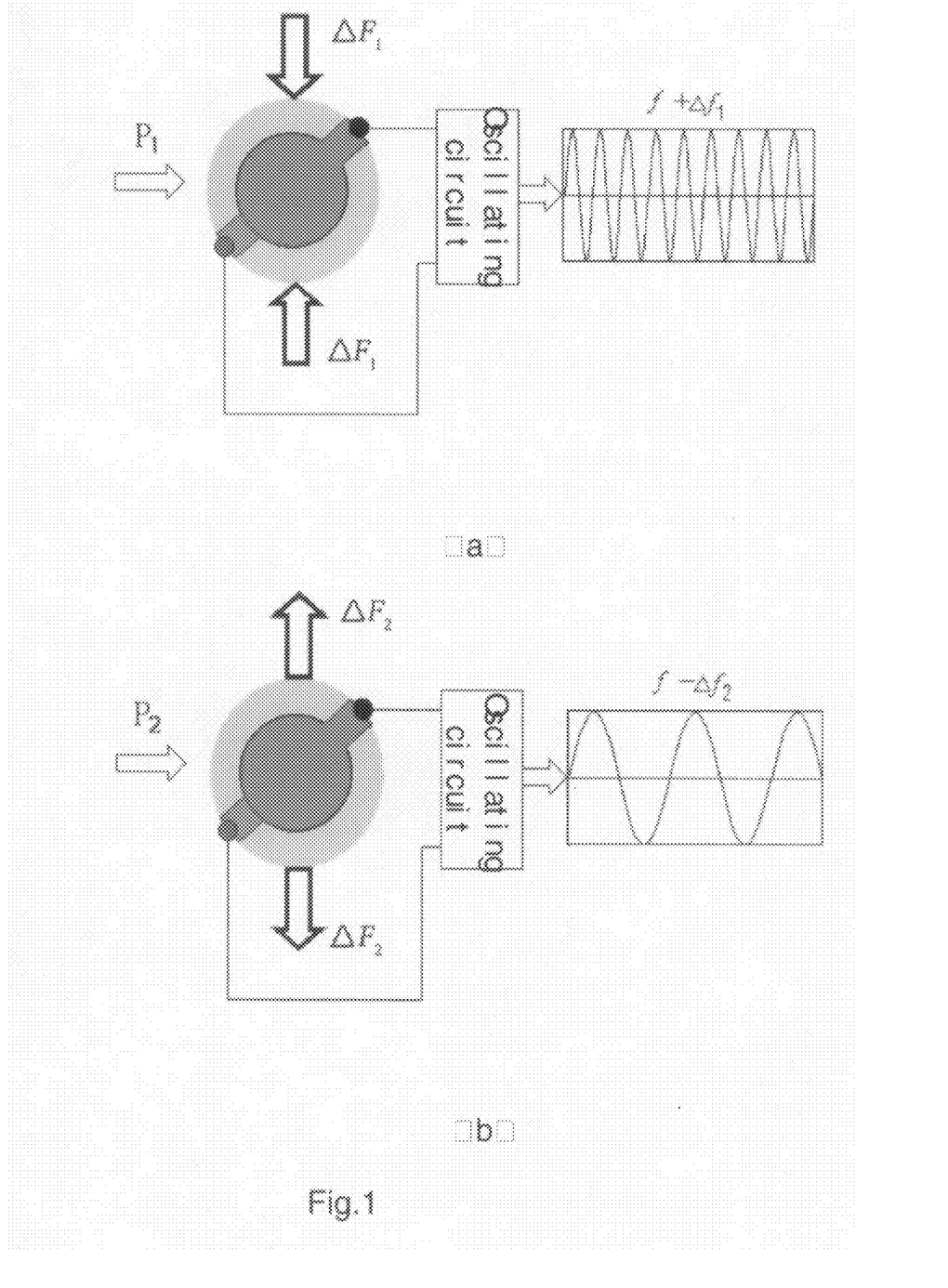
FIG. 1 is a schematic diagram of frequency variation when stressed in the radial direction according to a preferred embodiment of the present invention, wherein (a) is the schematic diagram of frequency variation when pressed, and (b) is the schematic diagram of frequency variation when pulled.

Accordingly, in order to accomplish the above object, the present invention adopts two symmetrical mounted round piezoelectric quartz wafers, transfer the deflection angle φ of the object to be measured to the force F exerted on two symmetrical mounted round piezoelectric quartz wafers. Utilizing the prominent force sensitivity of the piezoelectric quartz, the level attitude parameter of an objected can be detected through the frequency variation due to the force exerted on the two piezoelectric quartz wafers. As shown in FIG. 1, when the piezoelectric quartz wafer is stressed in the radial direction, such as ΔF1, the resonant frequency f changes to f+Δf1; when the piezoelectric quartz wafer is pulled in the radial direction, such as ΔF2, the resonant frequency f changes to f−Δf2, so the corresponding force variation ΔF1 and ΔF2 can be determined through detecting the frequency variation of the resonator. Therefore, when a tilt angle is inputted to the piezoelectric quartz level sensor, transfer the attitude corresponding to the tilt angle to a radial force exerting on the two symmetrical mounted round piezoelectric quartz wafers, and then the resonant frequency of one of the two symmetrical mounted round piezoelectric quartz wafers exerted a radial force increases to f+Δf1, while the other decreases to f−Δf2, so that the input tilt angle can be determined by detecting the frequency differential Δf=(f+Δf1)−(f−Δf2)=Δf1+Δf2 of the two symmetrical mounted round piezoelectric quartz wafers.

Figure 2:
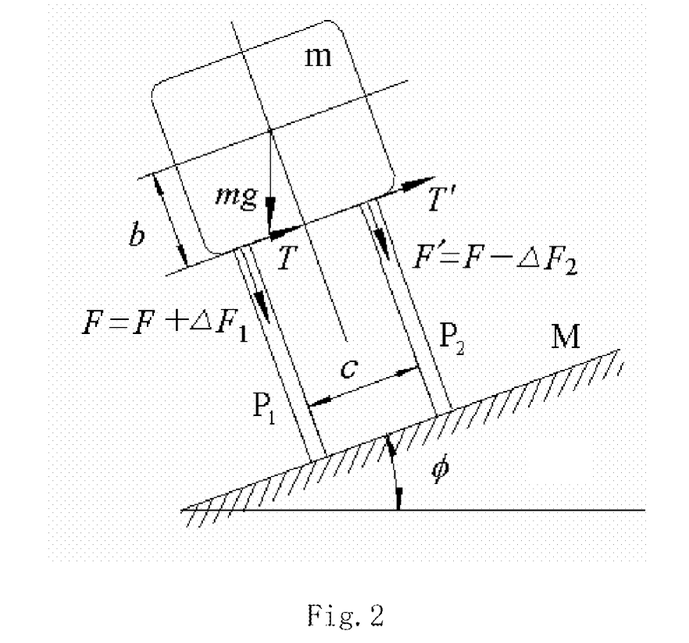
FIG. 2 is a schematic diagram of the new piezoelectric quartz level sensor according to the above preferred embodiment of the present invention.

The FIG. 2 illustrates the schematic view of the new piezoelectric quartz level sensor. When the level sensor deflects an angle φ, the relationship between the frequency differential Δf and φ can be determined through the pressure force variation of the two piezoelectric quartz resonator:

$$\Delta f = 2K_f \cdot \frac{f^2}{D \cdot n} \cdot \frac{b}{c} \cdot mg(\sin\phi - \sin\phi_0) \quad (1)$$
$$= K_\phi \cdot (\sin\phi - \sin\phi_0)$$

In this formula, $$K_\phi = 2K_f \cdot \frac{f^2}{D \cdot n} \cdot \frac{b}{c}.$$

mg is a proportional coefficient related to the sensitive element of the level sensor, $K_f$ is the Ratajski coefficient of the quartz resonator, D is the cross section width for passing Δf, and n is the resonant coefficient. From the formula (1) the tilt angle can be determined by detecting the frequency variation Δf of the quartz resonator.

The measurement range and resolution are two basic technical parameters of the sensor. It seems that the measurement range and resolution have no relationship, but actually relate to each other. On a given condition, one improves on the cost of the other. Therefore, the ratio of the measurement range and resolution K, as an index, can reflect the performance of the sensor. The inventor finds the relationship between the index K and the sensor:

$$K = \frac{\sqrt{2}\,\beta T_m D N_0}{\eta n f_0^2} \cdot K_f \frac{n f_0^2}{D} = \frac{\sqrt{2}\,\beta K_f N_0 T_m}{\eta} \quad (2)$$

In this formula, F0 is the base frequency of the quartz resonator, n is harmonic time, $K_f$ is the Ratajski coefficient of the quartz resonator, $T_m$ is the breaking limit force of the quartz resonator, β is the safety factor that is smaller than 1, $N_0$ is the frequency constant of the quartz resonator, η is the frequency stability of the quartz resonator, and D is the stress surface width of the quartz resonator.

The formula (2) reflects the relationship between the sensor performance index K and the quartz resonator structure parameter. Given the quartz resonator structure parameter, the K that the sensor can achieve can be calculated; or calculate the quartz resonator structure parameter according to the sensor performance index, so as to design a quartz resonator that can satisfy the demand.

The piezoelectric quartz level sensor of the present invention comprises a sensitive element, a first signal processing circuit, a second signal processing circuit, a base, an outer case and a socket. The base and the outer case are attached closely to form a cavity. The sensitive element and signal processing circuit are mounted on the base. The power and signal processed come in and out by a lead-in wire through the socket.

The sensitive element is composed of two round piezoelectric quartz wafers mounted on both sides of a center axial line of a column between the top plate and the bottom plate, and the two round piezoelectric quartz wafers are positioned between the top plate and the bottom plate, and fastened on the base by a pallet. A sensitive block presses on the top plate. A sealed cavity cover covers on the base through a sealed gasket, and is connected to the base by bolt to form a sealed cavity. Two round piezoelectric quartz wafers have three preferred embodiments, vertical parallel structure, level parallel structure, or inclined structure. A piezoelectric quartz wafers signal output connector and a vacuum pump are weld on the base.

Figure 8:
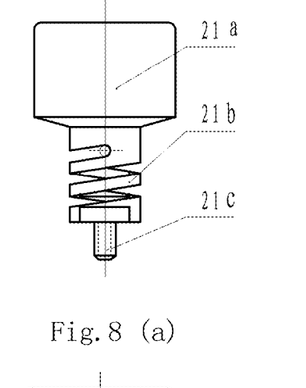
FIG. 8 is a perspective view of four structures of the sensitive block of the piezoelectric quartz level sensor according to the above preferred embodiment of the present invention, wherein (a) is a single-spiral structure, (b) is a double-spiral structure, and (c) is a structure with two side holes, and (d) is a structure with three holes.

The piezoelectric quartz level sensor further comprises an overload protective unit in the sensitive unit. The overload protective unit for the axial direction comprises an elastic element of the sensitive block, a shock absorber between the bottom plate and the pallet, and an adjustable axial retaining bolt on the column upside of the sensitive block. The overload protective unit for the transverse and longitudinal direction comprises an overload protective retaining frame and four adjustable axial retaining bolts around the column of the sensitive block. In the present invention, the sensitive block can be preferably embodied as four structures, as shown in FIG. 8, the sensitive block can be single-screw structure, double-screw structure, a structure with two side holes, or a structure with three holes.

The two-dimensional piezoelectric quartz level sensor of the present invention further provides a double layer shock absorber on the upside and downside of the sensitive element. The first layer shock absorber comprises a lower locating shock absorber added on the downside of the sensitive element, and an upper locating shock absorber added on the upside of the sensitive element, wherein the lower locating shock absorber is mounted on the frame base, and the upper locating shock absorber is mounted beneath the frame cover. The mounting frame comprise a frame base, a frame cover 41 and four frame columns, which are resembled by a bolt. The sensitive element 3, signal processing circuit and, and fixing board is suspended in the mounting frame through the lower locating shock absorber and the upper locating shock absorber to form a first shock absorber protective structure. The second layer shock absorber comprises a lower shock absorber provided between the inner side of the base and the frame base, and an upper shock absorber provide between the inner side of the top plate of the outer case and the frame cover, wherein the lower shock absorber and the upper shock absorber are fixedly suspended in the sealed cavity composed of base and the outer case, so that the whole mounting frame forms the second layer shock absorber protective structure.

The sealed cavity of the sensitive element of the one-dimensional piezoelectric quartz level sensor comprises a base, a sealed cavity cover and a sealed gasket. The sealed cavity is sealed by a zigzag structure or a wedge structure.

The piezoelectric quartz level sensor transfers the deflection angle of the object to the force exerted on two symmetrical mounted round piezoelectric quartz wafers, and then utilizing the prominent force sensitivity of the piezoelectric quartz, the level attitude parameter of an objected can be detected through the frequency variation due to the force exerted on the two piezoelectric quartz wafers. Therefore, the present invention can satisfy the demand of high stability and resolution, low non-linear degree, quick start time, wide measuring range and operating temperature, good ability to resist shock, and digital output.

These and other objectives, features, and advantages of the present invention will become apparent from the following detailed description, the accompanying drawings, and the appended claims.

DETAILED DESCRIPTION OF THE PREFERRED EMBODIMENT

Figure 3:
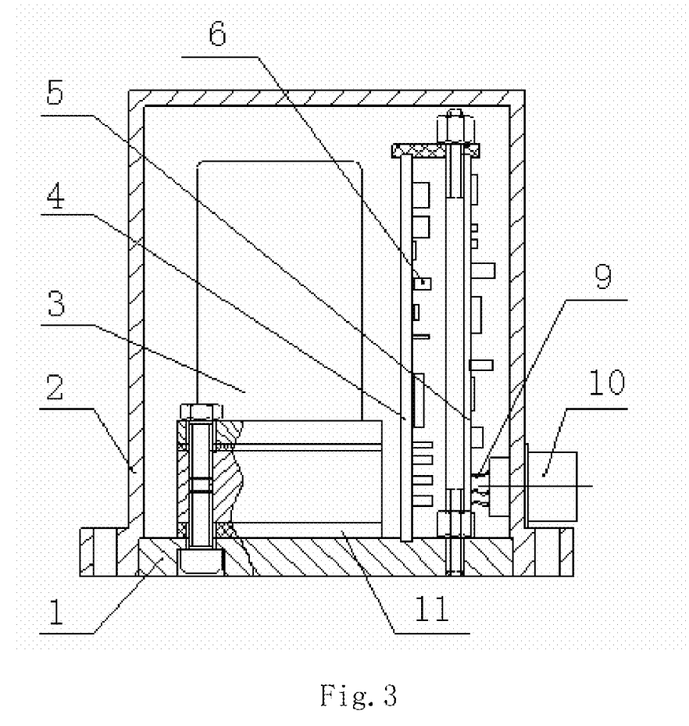
FIG. 3 is a schematic diagram of the one-dimensional piezoelectric quartz level sensor according to the above preferred embodiment of the present invention.
Figure 4:
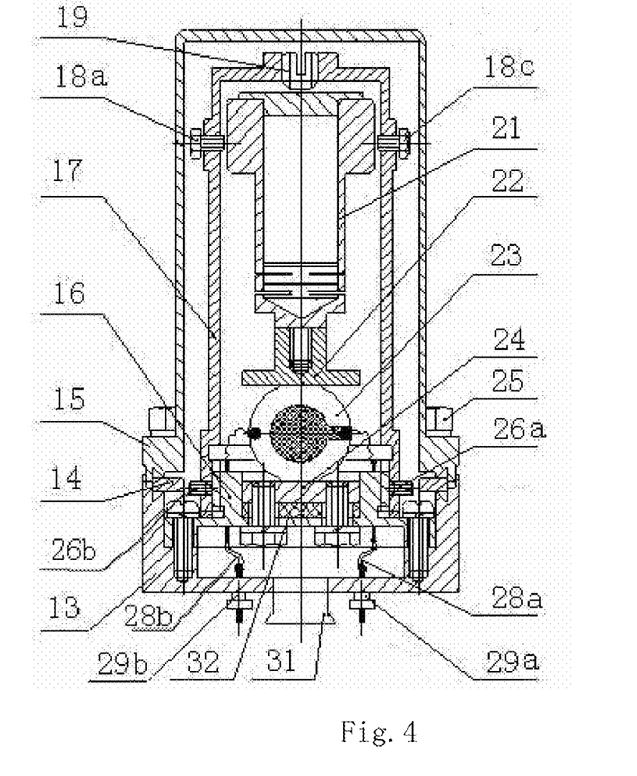
FIG. 4 is a sectional view of the one-dimensional piezoelectric quartz level sensor according to the above preferred embodiment of the present invention.
Figure 5:
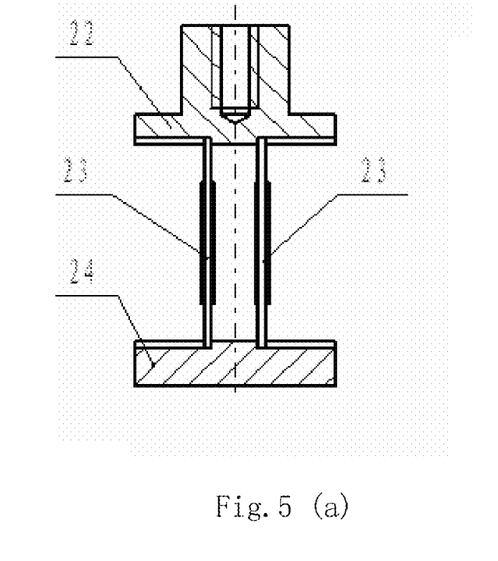
FIG. 5 is a perspective view of three mounting structures of the two piezoelectric quartz wafers of the sensitive elements according to the above preferred embodiment of the present invention, wherein (a) illustrates the vertical parallel structure, (b) illustrates the level parallel structure, and (c) illustrates the inclined structure.

The present invention, a new piezoelectric quartz level sensor, has two embodiments of one-dimensional and two-dimensional structures. As shown in FIG. 3, the one-dimensional piezoelectric quartz level sensor comprises a sensitive element 3, a first signal processing circuit 4, a second signal processing circuit 5, a bottom base frame 1, an outer case 2 and a socket 10. FIG. 4 is a sectional view of a one-dimensional piezoelectric quartz level sensor. The base 1 and the outer case 2 are attached closely to form a cavity. The one-dimensional piezoelectric quartz level sensor further comprises a shock pad 11 provided between the sensitive element 3 and the bottom base frame 1. The power and signal come in and out by a lead-in wire 9 through the socket 10. The sensitive element 3 is composed of two round piezoelectric quartz wafers 23 mounted on both sides of a center axial line of a column between the top plate 22 and the bottom plate 24, and the two round piezoelectric quartz wafers 23 are positioned between the top plate 22 and the bottom plate 24, and fastened on the base 13 by a pallet 16. A sensitive block 21 presses on the top plate 22. A sealed cavity cover 15 covers on the base 13 through a sealed gasket 14, and is connected to the base by bolt 25 to form a sealed cavity. The base 13 comprises a first vacuum connector 29a, a second vacuum connector 29b, and a vacuum pump 31. Two round piezoelectric quartz wafers have three preferred embodiments, as shown in FIG. 5, vertical parallel structure, level parallel structure, or inclined structure. In the vertical parallel structure, two round piezoelectric quartz wafers 23b1 and 23b2 mounted between the top plate 22b and bottom plate 24b in a level parallel manner. In the level parallel structure, two round piezoelectric quartz wafers 23c1 and 23c2 mounted between the top plate 22c and bottom plate 24c in a symmetrical inclined manner.

In the three above preferred mounting structures, the lead-in wire 28a and 28b of two piezoelectric quartz wafers are connected with the excitation circuits through vacuum connector 29a and 29b respectively forming an oscillating circuit. When the objected to be tested changes its attitude, the two round piezoelectric quartz wafers outputs in a differential frequency manner, so as to detect the inclined angle of an object.

As shown in FIG. 4, the one-dimensional piezoelectric quartz level sensor further comprises an overload protective unit for the axial, transverse, longitudinal direction of the piezoelectric quartz wafer 23 provided in the sensitive unit 3. The overload protective unit for the axial direction comprises an elastic element of the sensitive block 21, a shock absorber 32 between the bottom plate 24 and the pallet 16, and an adjustable axial retaining bolt 19 on the column upside of the sensitive block 21. The overload protective unit for the transverse and longitudinal direction comprises an overload protective retaining frame 17 and four adjustable axial retaining bolts 18a, 18b, 18c, and 18d around the column of the sensitive block 21.

Figure 6:
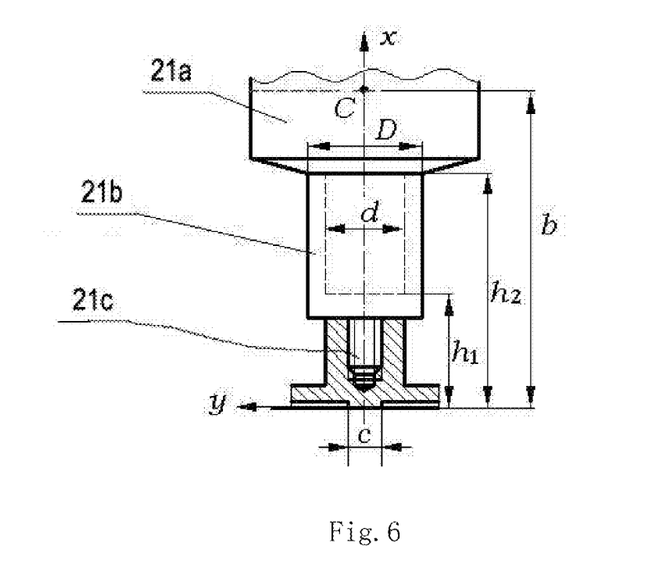
FIG. 6 is a perspective view of a sensitive block of the piezoelectric quartz level sensor according to the above preferred embodiment of the present invention.

In the sensitive block structure, as shown in FIG. 6, the column is a main body of the sensitive block, and the elastic element is a part of the shock absorbing system, which makes the sensor have a self-correction feature. As shown in FIG. 6, d and D is the inner and outer diameter of the elastic element respectively, h2–h1 is the height of the elastic element, and point C is the mass center of the sensitive block. In the present invention, the sensitive block can be preferably embodied as four structures, as shown in FIG. 8, the sensitive block 21 can be single-screw structure comprising three column segments with different diameter, comprising a mass body 21a as a main body of the sensitive block 21, an elastic body 21b for buffering, and a bolt segment 21c for mounting on the top plate wherein the mass body 21a is on the upside segment of the sensitive block 21 with larger diameter, the elastic body 21b is on the center segment of the sensitive block 21, and the bolt segment 21c is on the downside segment of the sensitive block 21. The elastic body 21b is single-screw spring structure. The sensitive block 21 can be double-screw structure comprising three column segments with different diameter, comprising a mass body 21d as a main body of the sensitive block 21, an elastic body 21e for buffering, and a bolt segment 21f for mounting on the top plate wherein the mass body 21d is on the upside segment of the sensitive block 21 with larger diameter, the elastic body 21e is on the center segment of the sensitive block 21, and the bolt segment 21f is on the downside segment of the sensitive block 21. The elastic body 21e is double-screw spring structure. The sensitive block 21 can be a structure with two side holes, comprising three column segments with different diameter, comprising a mass body 21m as a main body of the sensitive block 21, an elastic body 21n for buffering, and a bolt segment 21s for mounting on the top plate wherein the mass body 21m is on the upside segment of the sensitive block 21 with larger diameter, the elastic body 21n is on the center segment of the sensitive block 21, and the bolt segment 21s is on the downside segment of the sensitive block 21. The elastic body 21n is a structure with two side holes.

The sensitive block 21 can be a structure with three holes, comprising three column segments with different diameter, comprising a mass body 21x as a main body of the sensitive block 21, an elastic body 21y for buffering, and a bolt segment 21z for mounting on the top plate wherein the mass body 21x is on the upside segment of the sensitive block 21 with larger diameter, the elastic body 21y is on the center segment of the sensitive block 21, and the bolt segment 21z is on the downside segment of the sensitive block 21. The elastic body 21x is a structure with three holes.

Figure 7:
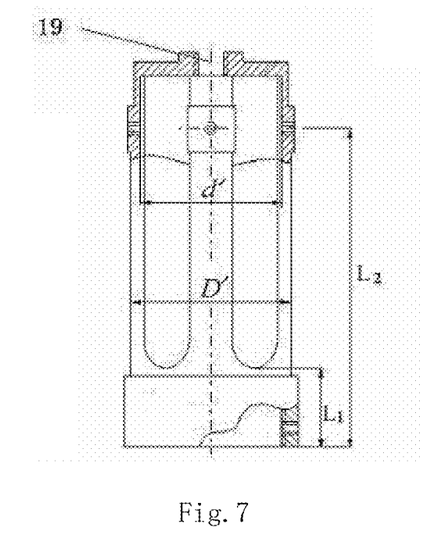
FIG. 7 is a perspective view of an overload protective retaining frame of the piezoelectric quartz level sensor according to the above preferred embodiment of the present invention.

As shown in FIG. 7, the overload protective retaining frame 17 is round barrel shape with through-caved work. The inner and outer diameter of the barrel shape frame is d' and D' respectively. Four transverse retaining bolt holes corresponding to the adjustable retaining bolts 18a, 18b, 18c, 18d and an axial retaining bolt 19 are on the upper end and top of the barrel shape frame. The retaining frame has fastening bolt 26a and 26b on the bottom. Four transverse retaining bolt holes have a distance $L_2$ from the bottom of the frame. The length of d, D, $h_1$, $h_2$ of the sensitive block and the position of C, and the matched retaining frame d', D' and $L_2$ value determine the measuring scale, the capability of resisting vibration and shock, and the capability of resisting overload.

When a strong shock and a high overload are exerted to the piezoelectric quartz level sensor, the shock pad of the sensitive element 11 shown in FIG. 3 and the shock absorber 32 of the pallet, the elastic column of the sensitive block 21, the overload protective frame 17 and the adjustable retaining bolts 18a, 18b, 18c, 18d around it, the retaining protective structure composed of axial retaining bolt 19 for absorbing shock and protecting overload can improve the environmental adaptive capacity of the sensor.

Figure 9:
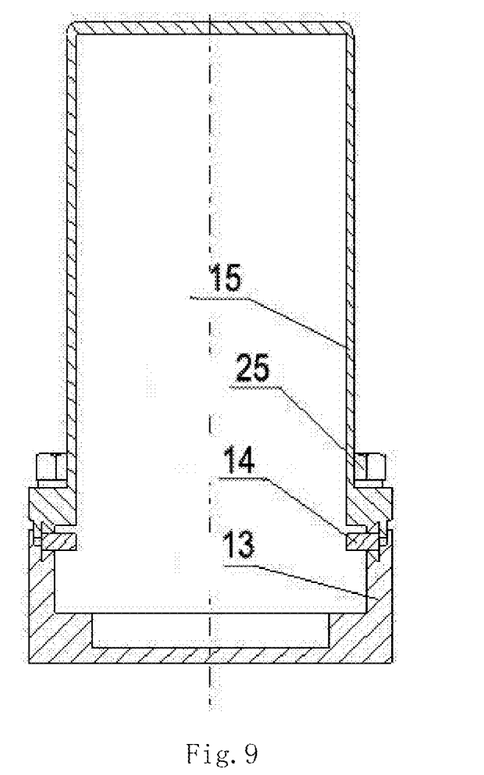
FIG. 9 is a sectional view of a vacuum sealed cavity of the sensitive element of the piezoelectric quartz level sensor according to the above preferred embodiment of the present invention.
Figure 10:
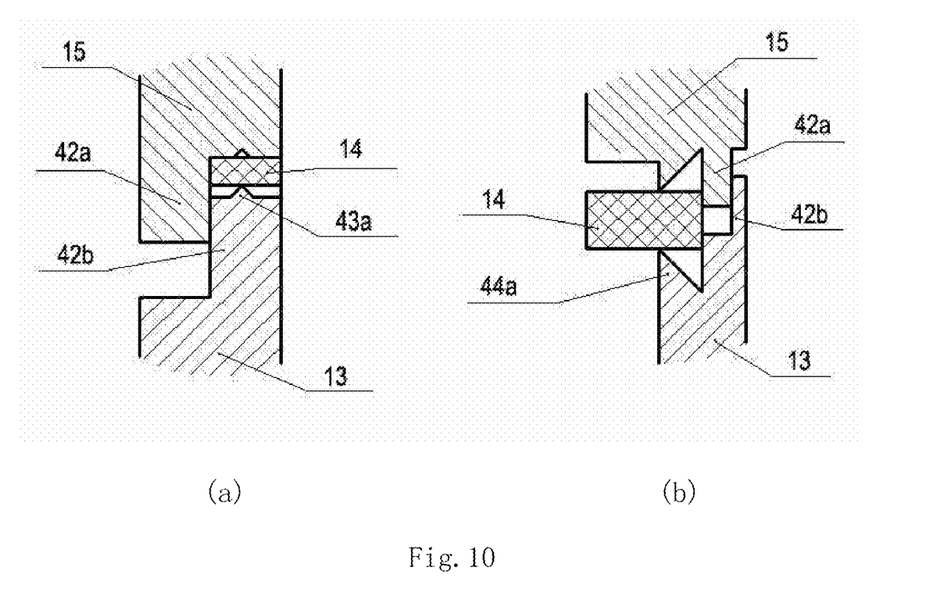
FIG. 10 is a sectional view of a sealed cavity of the sensitive element of the piezoelectric quartz level sensor according to the above preferred embodiment of the present invention, wherein (a) is a zigzag structure, and (b) is a wedge structure.

As shown in FIG. 9 the sealed cavity of the sensitive element of the one-dimensional piezoelectric quartz level sensor comprises a base, a sealed cavity cover and a sealed gasket. The sealed cavity is sealed by a zigzag structure or a wedge structure as shown in FIG. 10. The base 13 and the sealed cavity cover 15 have a sealed locating ring 42a and 42b respectively for locating the sealed gasket. Press the annular zigzag edge 43a or wedge edge 44a of the base 13 into the sealed gasket 14 by a resembling clip to seal the cavity, and fasten it by a bolt 25. The sealed cavity improves the working environment of the quartz wafer resonator, so as to improve the frequency stability of the quartz wafer resonator. The main performance index of the one-dimensional piezoelectric quartz level sensor of the present invention is shown in table 1.

TABLE 1 the main performance index of the different embodiments of the one-dimensional piezoelectric quartz level sensor of the present invention

| Embodiment | Measurement range | resolution | Responsive time(ms) | Nonlinear degree (% FS) | Stability (1/min) | Output form |
|---|---|---|---|---|---|---|
| Embodiment 1 | 0.0001°-50° | 0.001° | <50 | <0.1 | $1 \times 10^{-9}$ | Digital output |
| Embodiment 2 | 0.0001°-50° | 0.001° | <50 | <0.1 | $1 \times 10^{-9}$ | Digital output |

Figure 11:
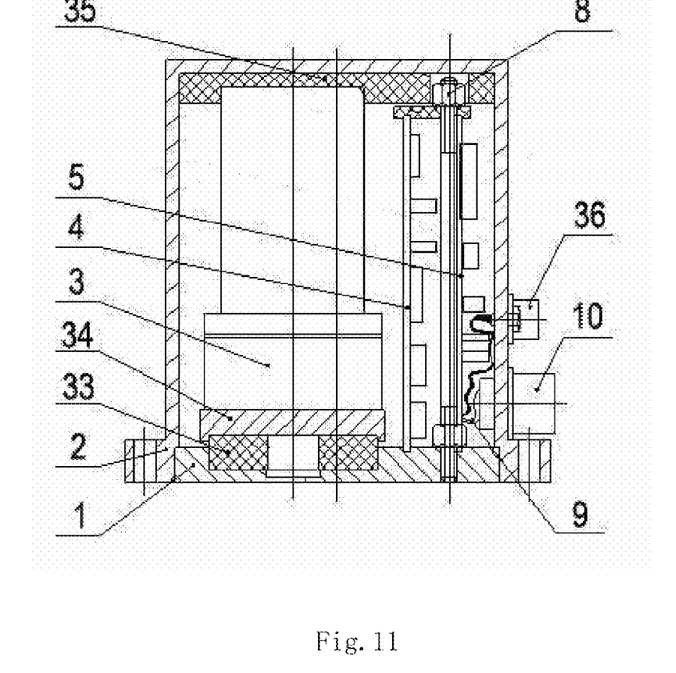
FIG. 11 is a sectional view of a two-dimensional piezoelectric quartz level sensor according to the above preferred embodiment of the present invention.

The two-dimensional piezoelectric quartz level sensor of the present invention comprises a sensitive element 3, a first signal processing circuit 4, a second signal processing circuit 5, a bottom base frame 1, an outer case 2 and a socket 10. As shown in FIG. 11, the bottom base frame 1 and the outer case 2 are attached closely to form a cavity. The sensitive element 3 is fixed on the fixing board 34. The signal processing circuit 4 and 5 is mounted on the bottom base frame 1. The power and signal come in and out by a lead-in wire 9 through the port 36 of the SR232.

Figure 12:
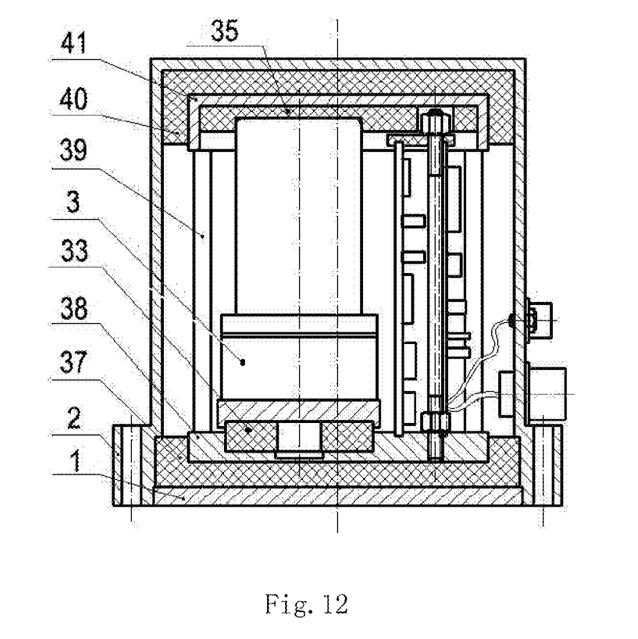
FIG. 12 is a perspective view of a double shock absorber of the two-dimensional piezoelectric quartz level sensor according to the above preferred embodiment of the present invention.

The two-dimensional piezoelectric quartz level sensor of the present invention further provides a double layer shock absorber on the upside and downside of the sensitive element 3. As shown in FIGS. 11 and 12, the first layer shock absorber comprises a lower locating shock absorber 33 added on the downside of the sensitive element 3, and an upper locating shock absorber 35 added on the upside of the sensitive element 3, wherein the lower locating shock absorber 33 is mounted on the frame base 38, and the upper locating shock absorber 35 is mounted beneath the frame cover 41. The mounting frame comprise a frame base 38, a frame cover 41 and four frame columns 39, which are resembled by a bolt. The sensitive element 3, signal processing circuit 4 and 5, and fixing board 34 is suspended in the mounting frame through the lower locating shock absorber 33 and the upper locating shock absorber 35 to form a first shock absorber protective structure. The second layer shock absorber comprises a lower shock absorber 37 provided between the inner side of the bottom base frame 1 and the frame base 38, and an upper shock absorber 40 provide between the inner side of the top plate of the outer case 2 and the frame cover 41, wherein the lower shock absorber 37 and the upper shock absorber 40 are fixedly suspended in the sealed cavity composed of bottom base frame 1 and the outer case 2, so that the whole mounting frame forms the second layer shock absorber protective structure.

Figure 13:
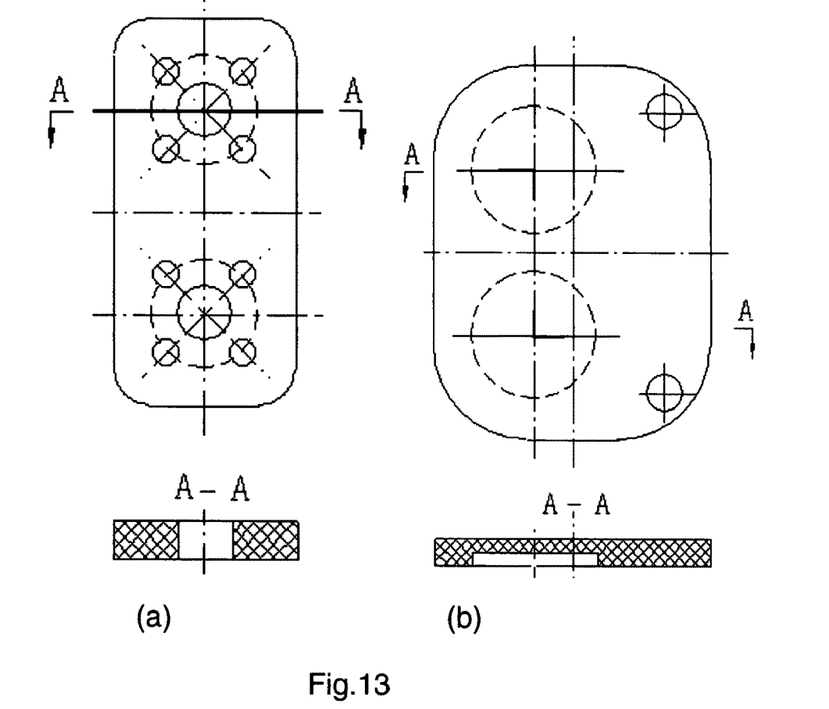
FIG. 13 is a perspective view of an upper locating shock absorber and lower locating shock absorber of the two-dimensional piezoelectric quartz level sensor according to the above preferred embodiment of the present invention, wherein (a) is the upper locating shock absorber, and (b) is the lower locating shock absorber.
Figure 14:
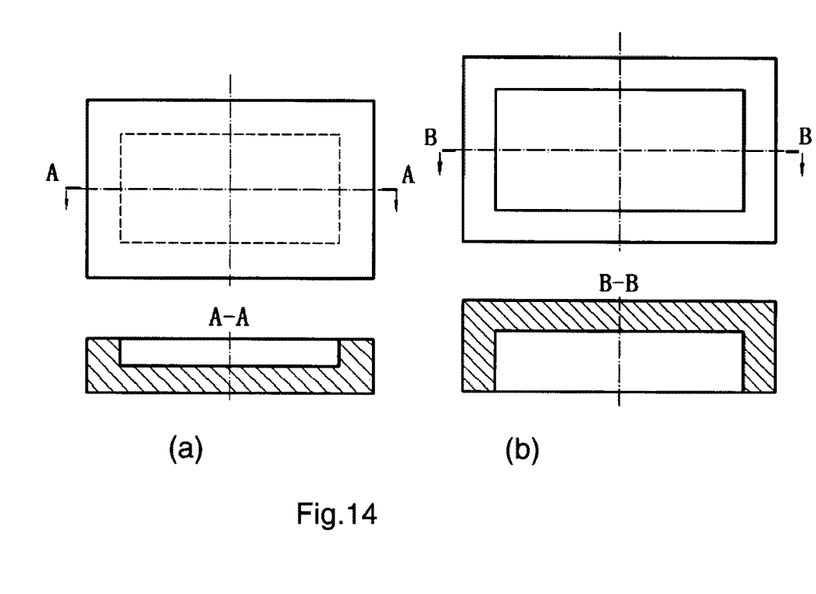
FIG. 14 is a perspective view of an upper shock absorber and lower shock absorber of the two-dimensional piezoelectric quartz level sensor according to the above preferred embodiment of the present invention, wherein (a) is the upper shock absorber, and (b) is the lower shock absorber.

The lower locating shock absorber 33, the upper locating shock absorber 35, the lower shock absorber 37 and the upper shock absorber 40 are made of silicon rubber, whose structures is shown in FIG. 13 and FIG. 14.

When a strong shock and a high overload are exerted to the piezoelectric quartz level sensor, the shock absorber and overload protective retaining structure composed of shock absorber and overload protective retaining device of sensitive element 3, the lower locating shock absorber 33, the upper locating shock absorber 35, the lower shock absorber 37 and the upper shock absorber 40 improves the capability of resisting shock of the sensor.

When a tilt angle is inputted, the two-dimensional piezoelectric quartz level sensor can sense the inputted tilt angle in both of the X-axial and Y-axial direction. The shock resisting capability of the two-dimensional piezoelectric quartz level sensor is up to 10000 g, the measurement scale is 0.0001°-50°. The main performance index of the two-dimensional piezoelectric quartz level sensor of different embodiments of the present invention is shown in table 2.

TABLE 2 the main performance index of the different embodiments of the two-dimensional piezoelectric quartz level sensor of the present invention

| Embodiment | Measurement range | resolution | Responsive time(ms) | Nonlinear degree (% FS) | Stability (1/min) | Output form |
|---|---|---|---|---|---|---|
| Embodiment 1 | 0.0001°-50° | 0.001° | <50 | <0.1 | $1 \times 10^{-9}$ | Digital output |
| Embodiment 2 | 0.0001°-50° | 0.001° | <50 | <0.1 | $1 \times 10^{-9}$ | D/A output |
| Embodiment 2 | 0.0001°-50° | 0.001° | <50 | <0.05 | $1 \times 10^{-9}$ | D/A output |

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A piezoelectric quartz level sensor, comprising a sensitive element, a signal processing circuit, a bottom base frame, an outer case and a socket, wherein said sensitive element comprises two round piezoelectric quartz wafers symmetrically mounted on the two sides of the axial line of a column between a top plate and a bottom plate, an overload protective unit on the axial, transverse, and vertical directions of the piezoelectric quartz wafers, wherein said axial overload protect unit comprises a sensitive block, a shock pad between said bottom plate and a pallet, and an adjustable axial retaining bolt on a mass column of the sensitive block, and said transverse and vertical overload protective unit comprises an overload protective frame, and four adjustable retaining bolts provided on said overload protective frame around said mass column, wherein said sensitive element further comprises a sealed cavity cover and a base that is fastened to said sealed cover.

2. The piezoelectric quartz level sensor, as recited in claim 1, wherein said two round piezoelectric quartz wafers can adopt a vertical parallel structure, wherein the vertical parallel structure is to mount said two round piezoelectric quartz wafers vertically between said top plate and bottom plate, wherein said two piezoelectric quartz wafers comprises lead-in wire connected with exciting circuit respectively.

3. The piezoelectric quartz level sensor, as recited in claim 1, wherein said two round piezoelectric quartz wafers can adopt a level parallel structure, wherein in the level parallel structure, said top plate is in centre, said bottom plate is extending symmetrically on both sides of said top plate, and said two piezoelectric quartz wafers are horizontally and symmetrically mounted between said top plate and bottom plate, wherein said two piezoelectric quartz wafers comprises lead-in wire connected with exciting circuit respectively.

4. The piezoelectric quartz level sensor, as recited in claim 1, wherein said two round piezoelectric quartz wafers can adopt an inclined structure, wherein in the inclined structure, sad top plate is in center, said bottom plate is extending symmetrically on both sides, said two round piezoelectric quartz wafers inclinedly and symmetrically mounted between said top plate and bottom plate, wherein said two piezoelectric quartz wafers comprises lead-in wire connected with exciting circuit respectively.

5. The piezoelectric quartz level sensor, as recited in claim 1, wherein said sensitive block adopts a single-screw structure, comprising three column segments with different diameters, comprising a mass body as a main body of the sensitive block, an elastic body for buffering, and a bolt segment for mounting on the top plate wherein the mass body is on the upside segment of the sensitive block with the larger diameter, the elastic body is on the center segment of the sensitive block, and the bolt segment is on the downside segment of the sensitive block, wherein the elastic body is a single-screw spring structure.

6. The piezoelectric quartz level sensor, as recited in claim 1, wherein said sensitive block adopts a double-screw structure, comprising three column segments with different diameters, comprising a mass body as a main body of the sensitive block, an elastic body for buffering, and a bolt segment for mounting on the top plate wherein the mass body is on the upside segment of the sensitive block with the larger diameter, the elastic body is on the center segment of the sensitive block, and the bolt segment is on the downside segment of the sensitive block, wherein said elastic body is a double-screw spring structure.

7. The piezoelectric quartz level sensor, as recited in claim 1, wherein said sensitive block adopts a structure with two side holes, comprising three column segments with different diameters, comprising a mass body as a main body of the sensitive block, an elastic body for buffering, and a bolt segment for mounting on the top plate wherein the mass body is on the upside segment of the sensitive block with the larger diameter, the elastic body is on the center segment of the sensitive block, and the bolt segment is on the downside segment of the sensitive block, wherein said elastic body is a structure with two side holes.

8. The piezoelectric quartz level sensor, as recited in claim 1, wherein said sensitive block adopts a structure with three holes, comprising three column segments with different diameters, comprising a mass body as a main body of the sensitive block, an elastic body for buffering, and a bolt segment for mounting on the top plate wherein the mass body is on the upside segment of the sensitive block with the larger diameter, the elastic body is on the center segment of the sensitive block, and the bolt segment is on the downside segment of the sensitive block, wherein said elastic body is a structure with three holes.

9. The piezoelectric quartz level sensor, as recited in claim 1, wherein said sealed cavity cover of said sensitive element is sealed to said base by a zigzag structure, wherein in said zigzag structure, the base and the sealed cavity cover have a sealed locating ring respectively for locating a sealed gasket provided between the base and the sealed cavity cover, wherein an annular zigzag edge of the base can be pressed into the sealed gasket to seal the cavity, and the sealed cavity cover and the base are fasten by a bolt.

10. The piezoelectric quartz level sensor, as recited in claim 1, wherein said sealed cavity cover of said sensitive element is sealed to said base by a wedge structure, wherein in said wedge structure, the base and the sealed cavity cover have a sealed locating ring respectively for locating a sealed gasket provided between the base and the sealed cavity cover, wherein an annular wedge edge of the base can be pressed into the sealed gasket to seal the cavity, and the sealed cavity cover and the base are fasten by a bolt.

11. The piezoelectric quartz level sensor, as recited in claim 1, wherein said piezoelectric quartz level sensor can be embodied as a two-dimensional piezoelectric quartz level sensor, wherein said two-dimensional piezoelectric quartz level sensor further comprises a first layer shock absorber and a second layer shock absorber, wherein the first layer shock absorber comprises a lower locating shock absorber mounted on a frame base on a downside of the sensitive element, and an upper locating shock absorber mounted beneath a frame cover on an upside of the sensitive element, wherein the frame base supports the frame cover by four frame columns, wherein the sensitive element, and the signal processing circuit are fastened between the lower locating shock absorber and the upper locating shock absorber; said second layer shock absorber comprises a lower shock absorber provided between an inner side of the bottom base frame and the frame base, and an upper shock absorber provide between an inner side of a top of the outer case and the frame cover, wherein the lower shock absorber and the upper shock absorber are fixedly suspended in a sealed cavity between the bottom base frame and the outer case.

12. The piezoelectric quartz level sensor, as recited in claim 11, wherein said upper locating shock absorber is a rectangular rubber cushion with four round corners having two round through holes along the long side of the rubber cushion.

13. The piezoelectric quartz level sensor, as recited in claim 11, wherein said upper locating shock absorber is a rectangular rubber cushion with four round corners having two round groove along two symmetrical long side corresponding to the shape of the sensitive element, and having two through holes along the long side of the rubber cushion so as to cover the upper locating shock absorber by the frame cover.

14. The piezoelectric quartz level sensor, as recited in claim 11, wherein said lower shock absorber is a rectangular rubber cushion having a slot corresponding to the shape of the frame base so as to put the frame base therein.

15. The piezoelectric quartz level sensor, as recited in claim 11, wherein said upper shock absorber is a rectangular rubber cushion having a slot corresponding to the shape of the frame cover so as to put the frame cover therein.

16. The piezoelectric quartz level sensor, as recited in claim 1, wherein said upper locating shock absorber, lower locating shock absorber, upper shock absorber, and lower shock absorber are made of elastic material, such as silicon rubber.

\* \* \* \* \*